United States Patent
Joo

(10) Patent No.: US 8,507,976 B2
(45) Date of Patent: Aug. 13, 2013

(54) NONVOLATILE MEMORY DEVICE AND METHOD FOR FABRICATING THE SAME

(75) Inventor: Han-Soo Joo, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/605,046

(22) Filed: Sep. 6, 2012

(65) Prior Publication Data

US 2013/0168745 A1    Jul. 4, 2013

(30) Foreign Application Priority Data

Dec. 29, 2011  (KR) .................. 10-2011-0146168

(51) Int. Cl.
  *H01L 29/792*  (2006.01)
  *H01L 21/336*  (2006.01)
  *H01L 29/66*  (2006.01)

(52) U.S. Cl.
  USPC .......... 257/326; 257/324; 257/325; 438/268; 438/269

(58) Field of Classification Search
  USPC ....................................... 257/326
  See application file for complete search history.

(56) References Cited

U.S. PATENT DOCUMENTS

| | | | |
|---|---|---|---|
| 8,203,884 B2* | 6/2012 | Kito et al. | 365/185.18 |
| 8,217,446 B2* | 7/2012 | Fukuzumi et al. | 257/324 |
| 8,278,699 B2* | 10/2012 | Tanaka et al. | 257/324 |
| 8,294,191 B2* | 10/2012 | Katsumata et al. | 257/314 |
| 8,294,199 B2* | 10/2012 | Yahashi et al. | 257/324 |
| 8,350,326 B2* | 1/2013 | Fukuzumi et al. | 257/342 |
| 2011/0193153 A1* | 8/2011 | Higuchi et al. | 257/324 |
| 2012/0231593 A1* | 9/2012 | Joo et al. | 438/264 |
| 2012/0299083 A1* | 11/2012 | Toratani et al. | 257/324 |

FOREIGN PATENT DOCUMENTS

| | | |
|---|---|---|
| KR | 1020100059543 | 6/2010 |
| KR | 1020120101818 | 9/2012 |

* cited by examiner

*Primary Examiner* — Matthew W Such
*Assistant Examiner* — Samuel Lair
(74) *Attorney, Agent, or Firm* — IP & T Group LLP

(57) ABSTRACT

A nonvolatile memory device includes a gate structure in which a plurality of interlayer dielectric layers and a plurality of gate electrodes are alternately stacked; a pass gate electrode lying under the gate structure; a sub channel hole defined in the pass gate electrode; a pair of main channel holes defined through the gate structure and communicating with the sub channel hole; a channel layer formed on inner walls of the pair of main channel holes and the sub channel hole; and a metallic substance layer contacting the channel layer in the sub channel hole.

16 Claims, 10 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2011-0146168, filed on Dec. 29, 2011, which is incorporated herein by reference in its entirety.

BACKGROUND

1. Field

Exemplary embodiments of the present invention relate to a nonvolatile memory device and a method for fabricating the same, and more particularly, to a nonvolatile memory device with a three-dimensional structure in which a plurality of memory cells are vertically stacked from a substrate and a method for fabricating the same.

2. Description of the Related Art

A nonvolatile memory device is a memory device which maintains data stored therein even when power supply is interrupted. Currently, various nonvolatile memory devices, for example, a flash memory and the like are widely used.

Recently, as improving the degree of integration of a nonvolatile memory device with a two-dimensional structure in which memory cells are formed in a single layer on a semiconductor substrate reaches a fabrication limit, a nonvolatile memory device with a three-dimensional structure in which a plurality of memory cells are formed along a channel layer vertically projecting from a semiconductor substrate has been suggested in the art. In detail, nonvolatile memory devices with a three-dimensional structure are generally divided into a structure which has a straight channel layer and a structure which has a U-shaped channel layer.

In the case of the conventional structure having the straight channel layer, while manufacturing processes are relatively simple and easy, since a source line is formed by implanting impurities into a silicon substrate, there are concerns in that a doping profile is likely to be changed by a subsequent annealing process and the like and source resistance is likely to increase. Although a method for forming a source line using a conductive substance such as a metal to reduce resistance has been proposed in the art, it may be difficult to control the doping profile of the source region under the channel layer.

In the case of the conventional structure having the U-shaped channel layer, while the above-described concerns may be solved, since the gate electrode of a pass transistor is formed long, channel resistance may increase. According to this fact, concerns are likely to occur in that the threshold voltage of the pass transistor increases and memory cell driving current is reduced.

SUMMARY

Embodiments of the present invention are directed to a nonvolatile memory device in which a metallic substance layer is formed to contact the channel layer of a pass transistor to reduce the channel resistance of the pass transistor to thereby stably secure memory cell driving current, and a method for fabricating the same.

In accordance with an embodiment of the present invention, a nonvolatile memory device includes: a gate structure in which a plurality of interlayer dielectric layers and a plurality of gate electrodes are alternately stacked; a pass gate electrode lying under the gate structure; a sub channel hole defined in the pass gate electrode; a pair of main channel holes defined through the gate structure and communicating with the sub channel hole; a channel layer formed on inner walls of the pair of main channel holes and the sub channel hole; and a metallic substance layer contacting the channel layer in the sub channel hole.

In accordance with another embodiment of the present invention, a method for fabricating a nonvolatile memory device includes: forming a pass gate electrode including a sacrificial layer over a substrate; alternately stacking a plurality of first substance layers and a plurality of second substance layers over the pass gate electrode; selectively etching the first substance layers and the second substance layers and defining a pair of main channel holes which expose the sacrificial layer; removing the sacrificial layer and defining a sub channel hole which communicates the pair of main channel holes with each other; forming a channel layer on inner walls of the pair of main channel holes and the sub channel hole; and forming a metallic substance layer in the sub channel hole.

According to the embodiments of the present invention, as a metallic substance layer is formed to contact the channel layer of a pass transistor, the channel resistance of the pass transistor may be reduced and memory cell driving current may be stably secured.

DETAILED DESCRIPTION

Figure 1A:
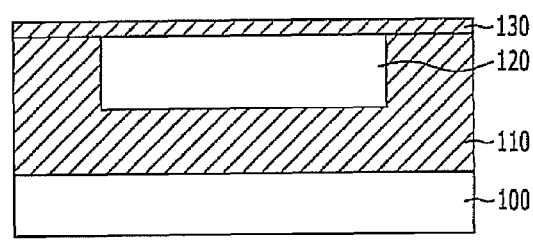
FIGS. 1A to 1F are cross-sectional views explaining a nonvolatile memory device and a method for fabricating the same in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
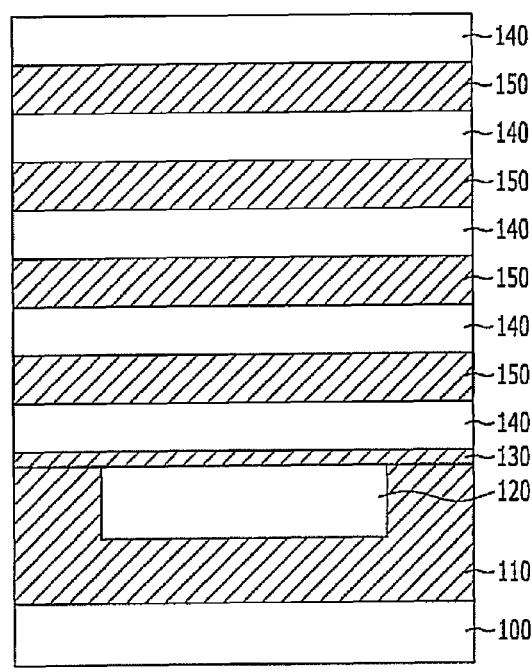
Figure 1C:
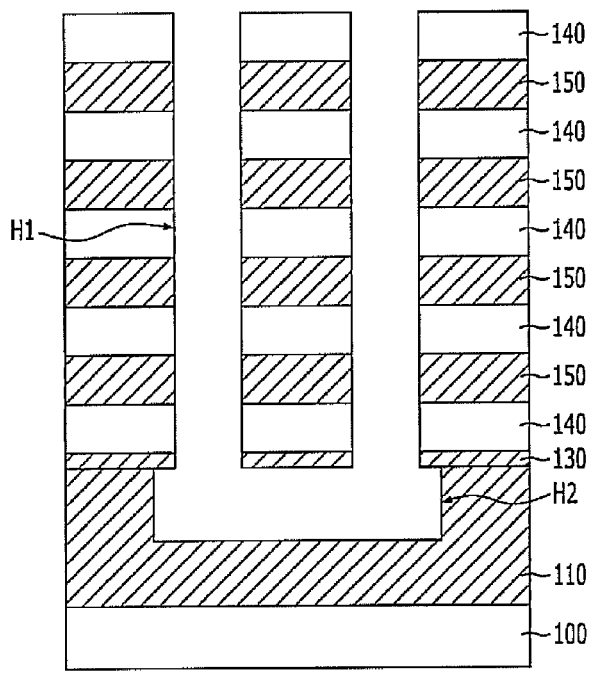
Figure 1D:
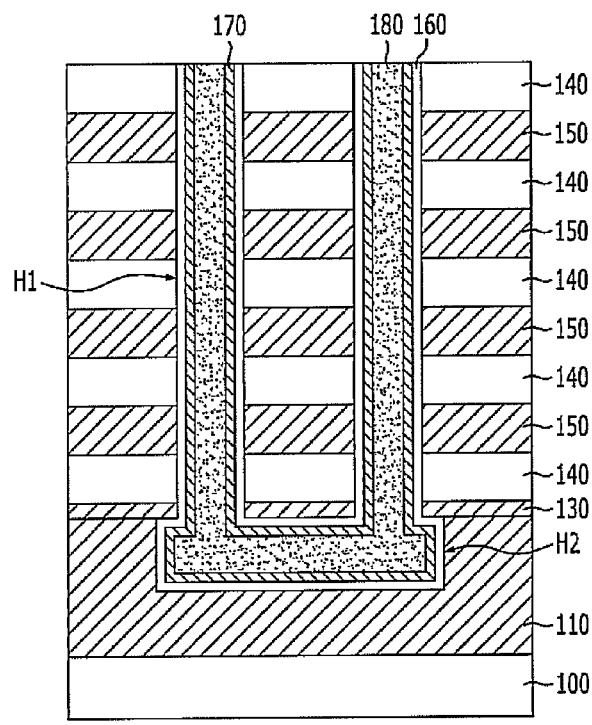
Figure 1E:
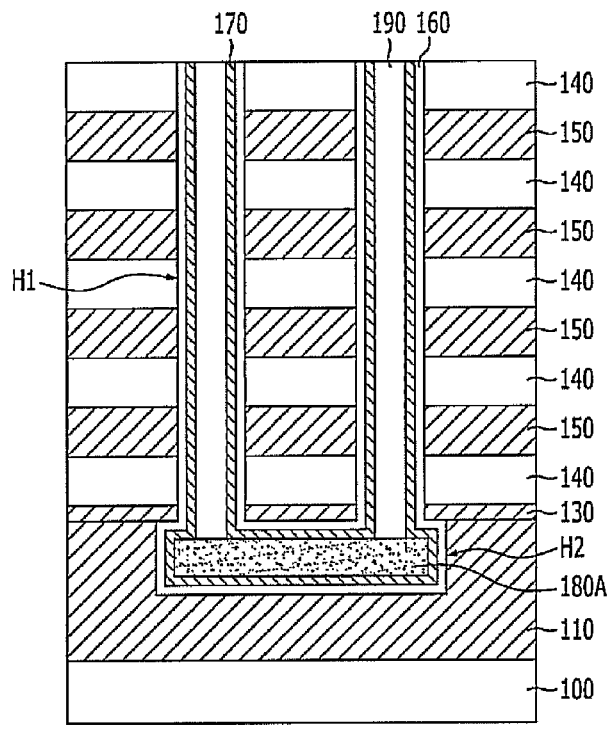
Figure 1F:
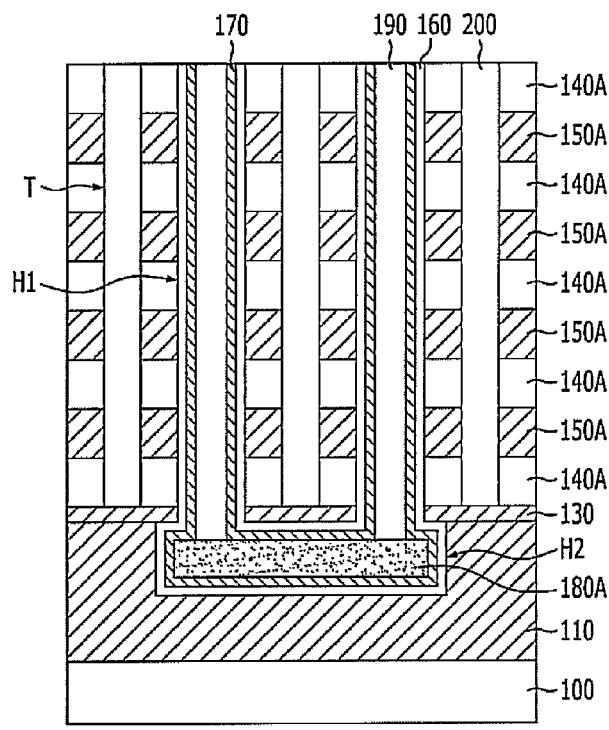

FIGS. 1A to 1F are cross-sectional views explaining a nonvolatile memory device and a method for fabricating the same in accordance with a first embodiment of the present invention. In particular, FIG. 1F is a cross-sectional view illustrating the nonvolatile memory device in accordance with the first embodiment of the present invention, and FIGS. 1A to 1E are cross-sectional views explaining processes for fabricating the nonvolatile memory device shown in FIG. 1F.

Referring to FIG. 1A, a first pass gate electrode layer 110 is formed on a substrate 100.

The substrate 100 may be a semiconductor substrate such as monocrystalline silicon and may include a predetermined underlying structure (not shown). Also, the first pass gate electrode layer 110 may be formed of a conductive substance, for example, doped polysilicon or a metal.

Then, after defining a groove by selectively etching the first pass gate electrode layer 110, the groove is filled with a sacrificial dielectric layer 120.

The sacrificial dielectric layer 120 is removed in a subsequent process and plays a role of providing a space in which a sub channel hole is to be defined as will be described later. The sacrificial dielectric layer 120 may be formed of a substance with an etching selectivity with respect to a second pass gate electrode layer, an interlayer dielectric layer, a conductor layer for a gate electrode, and the first pass gate electrode layer 110, for example, a nitride-based substance. The sacrificial dielectric layer 120 is disposed in the form of a matrix when viewed from the top, and has the shape of islands each of which has a major axis extending in a direction parallel to the plane of the drawing and a minor axis extending in a direction perpendicular to the plane of the drawing.

Then, a second pass gate electrode layer 130 is formed on the first pass gate electrode layer 110 and the sacrificial dielectric layer 120.

The second pass gate electrode layer 130 may be formed of a conductive substance, for example, doped polysilicon or a metal. Meanwhile, the first and second pass gate electrode layers 110 and 130 may have a shape which surrounds the sacrificial dielectric layer 120, as the gate electrode of a pass transistor.

Referring to FIG. 1B, a plurality of interlayer dielectric layers 140 and a plurality of conductive layers 150 for gate electrodes are alternately stacked on the second pass gate electrode layer 130. Hereinbelow, for the sake of convenience in explanation, the structure in which the plurality of interlayer dielectric layers 140 and the plurality of conductive layers 150 for gate electrodes are alternately stacked will be referred to as a gate structure.

The upper end and the lower end of the gate structure may be constituted by the interlayer dielectric layers 140. The interlayer dielectric layers 140 may be formed of an oxide-based substance. The conductive layers 150 for gate electrodes are to form the gate electrodes of memory cells or select transistors and may be formed of a conductive substance, for example, doped polysilicon or a metal. While four conductive layers 150 for gate electrodes are shown in the drawing, it is to be noted that this is nothing but an exemplification and the conductive layers 150 for gate electrodes may be formed by a number less than or greater than 4.

Referring to FIG. 1C, by selectively etching the gate structure and the second pass gate electrode layer 130, a pair of main channel holes H1 are defined in such a way as to expose the sacrificial dielectric layer 120. The main channel holes H1 are spaces for forming a channel layer as will be described below. The pair of main channel holes H1 may be defined in such a way as to expose each portion of the sacrificial dielectric layer 120.

Next, the sacrificial dielectric layer 120 exposed by the pair of main channel holes H1 is removed. In order to remove the sacrificial dielectric layer 120, a wet etching process may be performed using an etching selectivity with respect to the first and second pass gate electrode layers 110 and 130 and the gate structure. As a result of this process, a sub channel hole H2 is defined in a space from which the sacrificial dielectric layer 120 is removed, in such a way as to communicate the pair of main channel holes H1 with each other.

Referring to FIG. 1D, a memory layer 160 and a channel layer 170 are sequentially formed on the inner walls of the pair of main channel holes H1 and the sub channel hole H2.

The memory layer 160 may be formed by sequentially depositing a charge blocking layer, a charge trap layer and a tunnel dielectric layer. The tunnel dielectric layer is for charge tunneling and may be constituted by, for example, an oxide layer, the charge trap layer is for trapping charges and storing data and may be constituted by, for example, a nitride layer, and the charge blocking layer is for blocking movement of charges in the charge trap layer to an outside and may be constituted by, for example, an oxide layer. That is to say, the memory layer 160 may have a three-layered structure of ONO (oxide-nitride-oxide). The channel layer 170 may include portions used as the channels of memory cells or select transistors and portions used as the channels of pass transistors, and may be formed of a semiconductor substance, for example, such as polysilicon.

In succession, a metallic substance layer 180 is filled in the pair of main channel holes H1 and the sub channel hole H2 in which the channel layer 170 is formed. The metallic substance layer 180 may be formed of a metallic substance, for example, a metal, a metal nitride or a metal silicide.

Referring to FIG. 1E, the metallic substance layer 180 in the main channel holes H1 is removed. In order to remove the metallic substance layer 180, a dip-out type wet etching process may be performed, and an etching time is controlled such that the metallic substance layer 180 in the sub channel hole H2 is not removed. The metallic substance layer 180 remaining in the sub channel hole H2 as a result of this process will be referred to as a metallic substance layer pattern 180A.

The channel resistance of a pass transistor is reduced by the metallic substance layer pattern 180A which is in contact with the channel of the pass transistor, that is, the channel layer 170 in the sub channel hole H2, and accordingly, current flowing to the memory cells increases.

Thereafter, a first dielectric layer 190 is filled in the main channel holes H1. The first dielectric layer 190 may be formed of an oxide or nitride-based substance.

Referring to FIG. 1F, by selectively etching the gate structure on both sides of the main channel holes H1, trenches T are defined in such a way as to divide the gate structure. The trenches T may have the shapes of slits which extend in the direction perpendicular to the plane of the drawing. A plurality of trenches T may be defined parallel to one another. As a result of this process, gate electrodes 150A, which surround the main channel holes H1 and extend in the direction perpendicular to the plane of the drawing, are formed. The remaining interlayer dielectric layers 140 will be referred to as interlayer dielectric layer patterns 140A.

Then, a second dielectric layer 200 is filled in the trenches T. The second dielectric layer 200 may be formed of an oxide or nitride-based substance.

A nonvolatile memory device in accordance with the first embodiment of the present invention as shown in FIG. 1F may be fabricated through the method as described above.

Referring to FIG. 1F, the nonvolatile memory device in accordance with the first embodiment of the present invention may include the gate structure in which the plurality of interlayer dielectric layer patterns 140A and the plurality of gate electrodes 150A are alternately stacked, the pass gate electrode under the gate structure, the sub channel hole H2 defined in the pass gate electrode, the pair of main channel holes H1 defined through the gate structure and communicating with the sub channel hole H2, the channel layer 170 formed along the inner walls of the pair of main channel holes H1 and the sub channel hole H2, the metallic substance layer pattern 180A contacting the channel layer 170 in the sub channel hole H2, and the memory layer 160 interposed between the channel layer 170 and the gate electrodes 150A.

The pass gate electrode as the gate electrode of the pass transistor is constituted by the first and second pass gate electrode layers 110 and 130.

The metallic substance layer pattern 180A may include a metallic substance, for example, a metal, a metal nitride or a metal silicide, and may completely fill the sub channel hole H2.

Figure 2A:
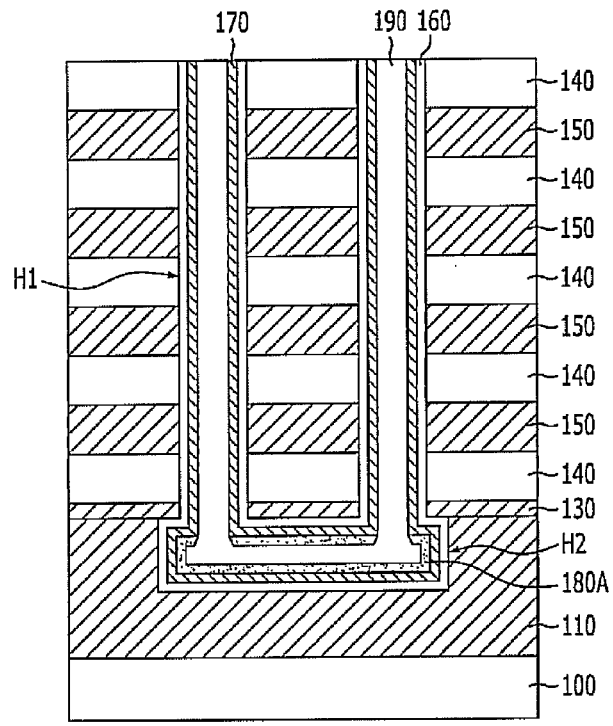
FIGS. 2A and 2B are cross-sectional views explaining a nonvolatile memory device and a method for fabricating the same in accordance with a second embodiment of the present invention.
Figure 2B:
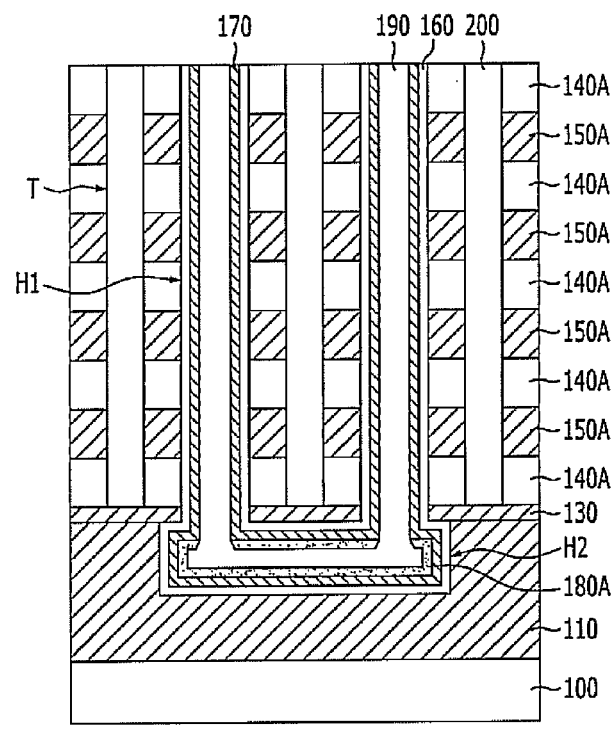

FIGS. 2A and 2B are cross-sectional views explaining a nonvolatile memory device and a method for fabricating the same in accordance with a second embodiment of the present invention. In describing the present embodiment, detailed description of component parts substantially the same as those of the aforementioned first embodiment will be omitted. After the processes shown in FIGS. 1A to 1D are first performed, the processes shown in FIGS. 2A and 2B are performed.

Referring to FIG. 2A, the metallic substance layer 180 formed in the remaining portion excluding the inner wall of the sub channel hole H2 is removed. In order to remove the metallic substance layer 180, a dip-out type wet etching process may be performed, and an etching time is controlled such that, unlike the first embodiment, not only the metallic substance layer 180 in the main channel holes H1 is removed, but also the metallic substance layer 180 in the sub channel hole H2 is partially removed. The metallic substance layer 180 remaining in the sub channel hole H2 as a result of this process will be referred to as a metallic substance layer pattern 180A.

Then, the first dielectric layer 190 is filled in the main channel holes H1 and the sub channel hole H2. The first dielectric layer 190 may be formed of an oxide or nitride-based substance.

Referring to FIG. 2B, by selectively etching the gate structure on both sides of the main channel holes H1, trenches T are defined in such a way as to divide the gate structure. As a result of this process, gate electrodes 150A, which surround the main channel holes H1 and extend in the direction perpendicular to the plane of the drawing, are formed. The remaining interlayer dielectric layer 140 will be referred to as interlayer dielectric layer patterns 140A.

Then, a second dielectric layer 200 is filled in the trenches T. The second dielectric layer 200 may be formed of an oxide or nitride-based substance.

The second embodiment described above is different from the first embodiment in that the metallic substance layer pattern 180A is formed to a thin thickness not completely filling the sub channel hole H2.

FIGS. 3A to 3G are cross-sectional views explaining a nonvolatile memory device and a method for fabricating the same in accordance with a third embodiment of the present invention. In describing the present embodiment, detailed description of component parts substantially the same as those of the aforementioned first embodiment will be omitted.

Figure 3A:
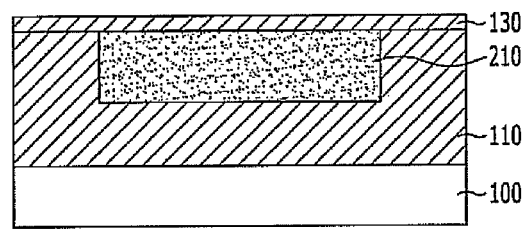
FIGS. 3A to 3G are cross-sectional views explaining a nonvolatile memory device and a method for fabricating the same in accordance with a third embodiment of the present invention.

Referring to FIG. 3A, a first pass gate electrode layer 110 is formed on a substrate 100. The substrate 100 may be a semiconductor substrate such as monocrystalline silicon, and the first pass gate electrode layer 110 may be formed of a conductive substance, for example, doped polysilicon or a metal.

Then, after defining a groove by selectively etching the first pass gate electrode layer 110, the groove is filled with a sacrificial metallic substance layer 210. The sacrificial metallic substance layer 210 may be formed of a metallic substance, for example, a metal, a metal nitride or a metal silicide. The sacrificial metallic substance layer 210 has the shape of islands which are disposed in the form of a matrix.

Then, a second pass gate electrode layer 130 is formed on the first pass gate electrode layer 110 and the sacrificial metallic substance layer 210. The second pass gate electrode layer 130 may be formed of a conductive substance, for example, doped polysilicon or a metal. Meanwhile, the first and second pass gate electrode layers 110 and 130 may have a shape which surrounds the sacrificial metallic substance layer 210, as the gate electrode of a pass transistor.

Figure 3B:
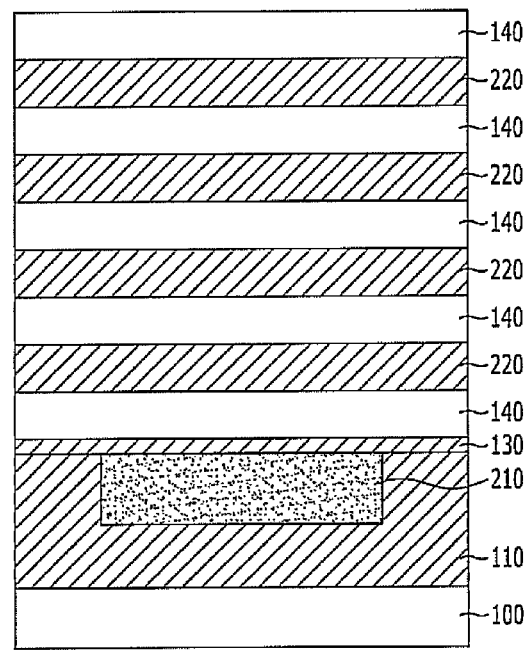

Referring to FIG. 3B, a plurality of interlayer dielectric layers 140 and a plurality of sacrificial layers 220 are alternately stacked on the second pass gate electrode layer 130.

The interlayer dielectric layers 140 may be formed of an oxide-based substance. The sacrificial layers 220 are removed in a subsequent process and play a role of providing spaces in which gate electrodes are to be formed as will be described later. The sacrificial layers 220 may be formed of a substance with an etching selectivity with respect to the interlayer dielectric layers 140, for example, a nitride-based substance.

Figure 3C:
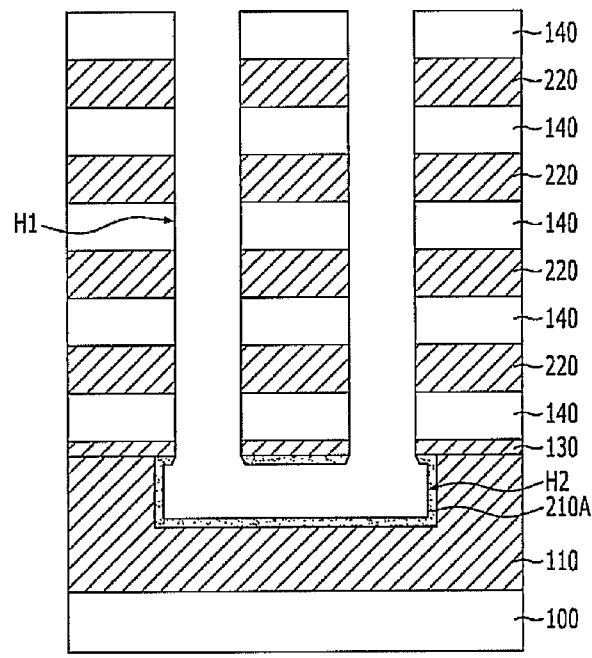

Referring to FIG. 3C, by selectively etching the sacrificial layers 220, the interlayer dielectric layers 140 and the second pass gate electrode layer 130, a pair of main channel holes H1 are defined in such a way as to expose the sacrificial metallic substance layer 210.

Then, the sacrificial metallic substance layer 210 exposed by the pair of main channel holes H1 is partially removed. In order to partially remove the sacrificial metallic substance layer 210, a dip-out type wet etching process may be performed, and an etching time is controlled such that the sacrificial metallic substance layer 210 formed on the inner walls of the first and second pass gate electrode layers 110 and 130 is not removed. As a result of this process, a sub channel hole H2 is defined in a space which is created due to partial removal of the sacrificial metallic substance layer 210, in such a way as to communicate the pair of main channel holes H1 with each other. The sacrificial metallic substance layer 210 remaining in the sub channel hole H2 will be referred to as a sacrificial metallic substance layer pattern 210A.

Figure 3D:
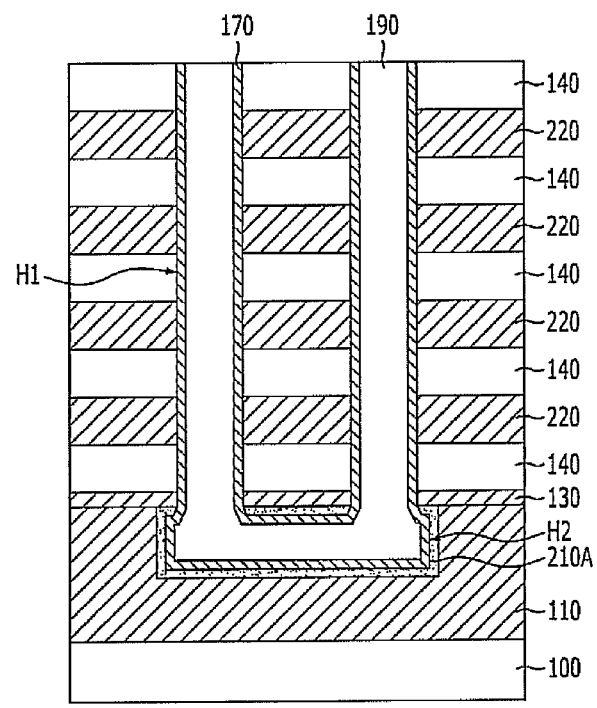

Referring to FIG. 3D, a channel layer 170 is formed on the inner walls of the pair of main channel holes H1 and the sub channel hole H2. The channel layer 170 may include portions used as the channels of memory cells or select transistors and portions used as the channels of pass transistors, and may be formed of a semiconductor substance, for example, such as polysilicon.

In succession, a first dielectric layer 190 is filled in the pair of main channel holes H1 and the sub channel hole H2 in which the channel layer 170 is formed. The first dielectric layer 190 may be formed of an oxide-based substance.

Figure 3E:
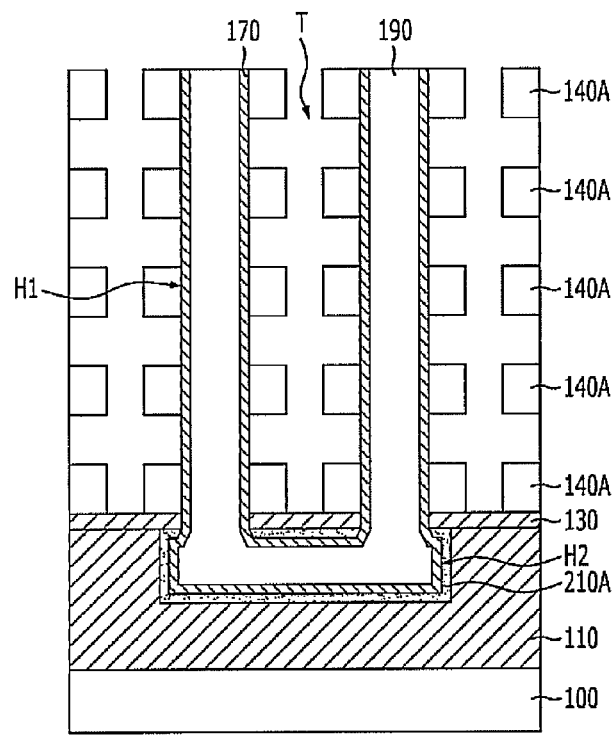

Referring to FIG. 3E, by selectively etching the interlayer dielectric layers 140 and the sacrificial layers 220 on both sides of the main channel holes H1, trenches T are defined in such a way as to divide the interlayer dielectric layers 140 and the sacrificial layers 220. A plurality of trenches T may be defined to have the shapes of slits which extend in the direction crossing with the plane of the drawing. The remaining interlayer dielectric layers 140 will be referred to as interlayer dielectric layer patterns 140A.

Then, the sacrificial layers 220 exposed by the trenches T are removed. In order to remove the sacrificial layers 220, a wet etching process using an etching selectivity with respect to the interlayer dielectric layer patterns 140A may be performed.

Figure 3F:
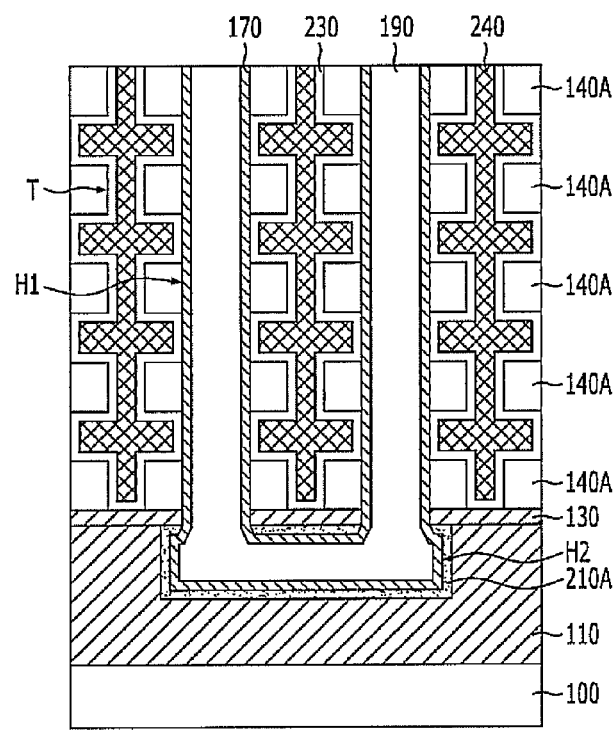

Referring to FIG. 3F, a memory layer 230 is formed on spaces which are created by the removal of the sacrificial layers 220 through the trenches T. The memory layer 230 may be formed by sequentially depositing a tunnel dielectric layer, a charge trap layer and a charge blocking layer and may have a three-layered structure of ONO.

Next, a conductive layer 240 for gate electrodes is formed on the memory layer 230 in such a way as to fill the spaces which are created by the removal of the sacrificial layers 220. The conductive layer 240 for gate electrodes may be formed by depositing a conductive substance, for example, a metal, a metal nitride or doped polysilicon.

Figure 3G:
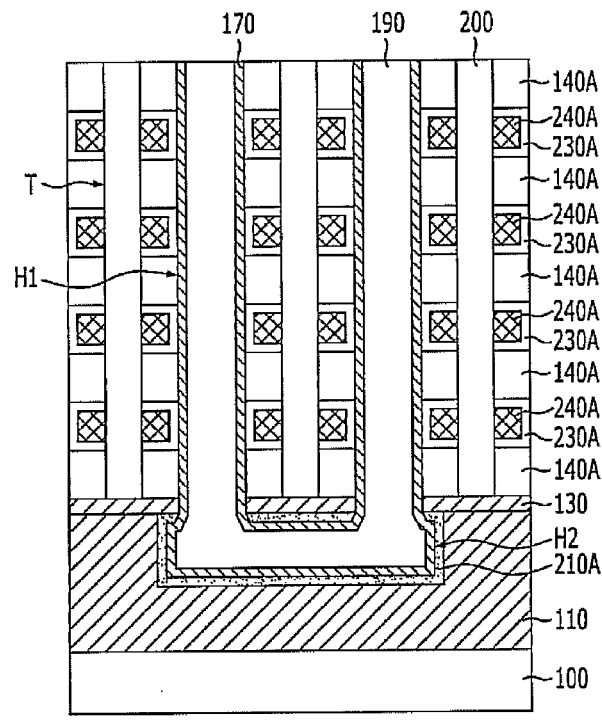

Referring to FIG. 3G, by etching the memory layer 230 and the conductive layer 240 for gate electrodes 240 in the trenches T until the interlayer dielectric layer patterns 140A are exposed, the memory layer 230 and the conductive layer 240 for gate electrodes are divided by the trenches T. As a result of this process, gate electrodes 240A are formed between the interlayer dielectric layer patterns 140A, and the remaining memory layer 230 is referred to as memory layer patterns 230A.

Then, a second dielectric layer 200 is filled in the trenches T. The second dielectric layer 200 may be formed of an oxide or nitride-based substance.

Figure 4A:
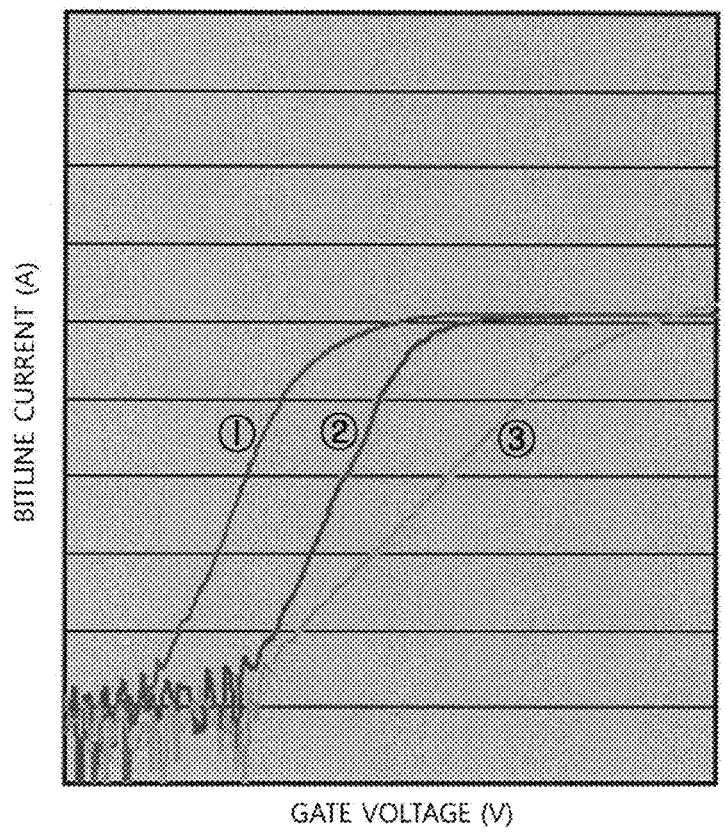
FIG. 4A is a graph showing the current-voltage characteristic of a conventional nonvolatile memory device.
Figure 4B:
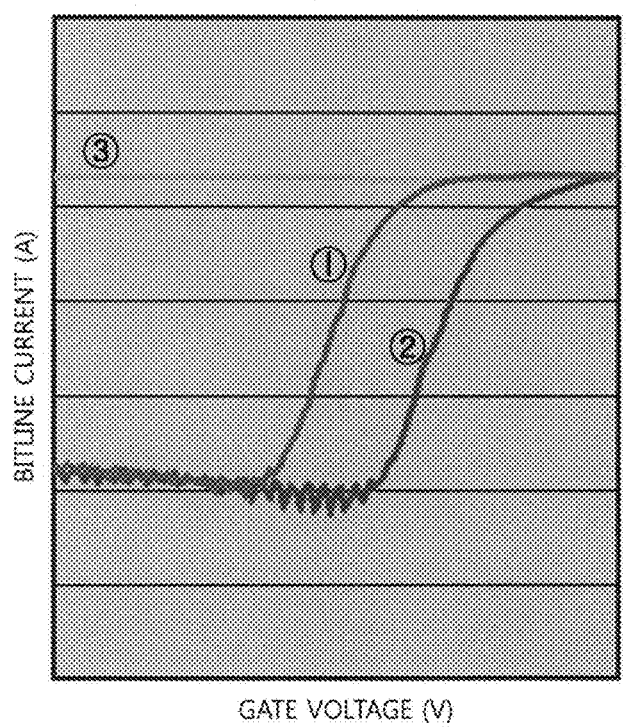
FIG. 4B is a graph showing the current-voltage characteristic of a nonvolatile memory device in accordance with the embodiments of the present invention.

FIG. 4A is a graph showing the current-voltage characteristic of a conventional nonvolatile memory device, and FIG. 4B is a graph showing the current-voltage characteristic of a nonvolatile memory device in accordance with the embodiments of the present invention.

Referring to FIGS. 4A and 4B, ①, ② and ③ show bit line current A according to gate voltages V of a memory cell transistor, a select transistor and a pass transistor, respectively.

In the case of the conventional nonvolatile memory device, increase in the threshold voltage of the pass transistor and resultant reduction in driving current of the memory cell and the select transistor are exhibited. However, in the case of the nonvolatile memory device in accordance with the embodiments of the present invention, the pass transistor may be maintained in a turn-on state, and accordingly, the memory cell and the select transistor exhibit stable current-voltage characteristics.

As is apparent from the above descriptions, the nonvolatile memory device and the method for fabricating the same according to the embodiments of the present invention provide advantages in that, since a metallic substance layer is formed to contact the channel layer of a pass transistor, the channel resistance of the pass transistor may be reduced and memory cell driving current may be stably secured.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a gate structure in which a plurality of interlayer dielectric layers and a plurality of gate electrodes are alternately stacked;
   a pass gate electrode lying under the gate structure;
   a sub channel hole defined in the pass gate electrode;
   a pair of main channel holes defined through the gate structure and communicating with the sub channel hole;
   a channel layer formed on inner walls of the pair of main channel holes and the sub channel hole; and
   a metallic substance layer contacting the channel layer in the sub channel hole.

2. The nonvolatile memory device of claim 1, wherein the metallic substance layer comprises at least any one selected from the group consisting of a metal, a metal nitride and a metal silicide.

3. The nonvolatile memory device of claim 1, wherein the metallic substance layer completely fills the sub channel hole.

4. The nonvolatile memory device of claim 1, wherein the metallic substance layer is formed of a thin metallic substance layer contacting the channel layer.

5. The nonvolatile memory device of claim 1, further comprising:
   a memory layer interposed between the channel layer and the gate electrodes.

6. A method for fabricating a nonvolatile memory device, comprising:
   forming a pass gate electrode including a sacrificial layer over a substrate;
   alternately stacking a plurality of first substance layers and a plurality of second substance layers over the pass gate electrode;
   selectively etching the first substance layers and the second substance layers and defining a pair of main channel holes which expose the sacrificial layer;
   removing the sacrificial layer and defining a sub channel hole which communicates the pair of main channel holes with each other;
   forming a channel layer on inner walls of the pair of main channel holes and the sub channel hole; and
   forming a metallic substance layer in the sub channel hole.

7. The method of claim 6, wherein the first substance layers comprise interlayer dielectric layers, and the second substance layers comprise conductive layers.

8. The method of claim 6, wherein the first substance layers comprise interlayer dielectric layers, and the second substance layers comprise sacrificial layers.

9. The method of claim 6, wherein the sacrificial layer is formed of a metallic substance.

10. The method of claim 6, wherein the metallic substance layer is formed of at least any one selected from the group consisting of a metal, a metal nitride and a metal silicide.

11. The method of claim 6, wherein, after the forming of the metallic substance layer, the method further comprises:
   removing the metallic substance layer which is formed on a remaining portion excluding an inner wall of the sub channel hole.

12. The method of claim 6, wherein, after the defining of the sub channel hole, the method further comprises:
   forming a memory layer to be interposed between the channel layer and the gate electrodes.

13. The method of claim 6, wherein the forming of the pass gate electrode comprises:
   forming a first pass gate electrode layer over the substrate;
   selectively etching the first pass gate electrode layer and defining a groove; and
   forming the sacrificial layer in the groove.

14. The method of claim 8, wherein the sacrificial layers are formed of a substance which has an etching selectivity with respect to the interlayer dielectric layers.

15. The method of claim 8, wherein, after the forming of the channel layer, the method further comprises:

defining trenches which pass through the interlayer dielectric layers and the sacrificial layers, on both sides of the main channel holes;
removing the sacrificial layers exposed by the trenches; and
forming gate electrodes in spaces which are created by removal of the sacrificial layers.

16. The method of claim 13, wherein, after the forming of the sacrificial layer, the method further comprises:
forming a second pass gate electrode layer over the first pass gate electrode layer and the sacrificial layer.

* * * * *